(12) United States Patent
Govyadinov et al.

(10) Patent No.: US 11,988,594 B2
(45) Date of Patent: May 21, 2024

(54) PARTICLE CATEGORIZATION

(71) Applicant: Hewlett-Packard Development Company, L.P., Spring, TX (US)

(72) Inventors: Alexander Govyadinov, Corvallis, OR (US); Pavel Kornilovich, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 18/196,947

(22) Filed: May 12, 2023

(65) Prior Publication Data

US 2023/0280263 A1 Sep. 7, 2023

Related U.S. Application Data

(63) Continuation of application No. 16/768,878, filed as application No. PCT/US2018/015783 on Jan. 29, 2018, now Pat. No. 11,686,664.

(51) Int. Cl.
*G01N 15/14* (2006.01)
*B01L 3/00* (2006.01)
(Continued)

(52) U.S. Cl.
CPC ...... *G01N 15/1484* (2013.01); *B01L 3/50273* (2013.01); *H10N 30/2047* (2023.02);
(Continued)

(58) Field of Classification Search
CPC ... G01N 2015/1081; G01N 2015/1087; G01N 2015/1093; G01N 2015/149;
(Continued)

(56) References Cited

U.S. PATENT DOCUMENTS 5,837,200 A * 11/1998 Diessel ................. B03C 1/035
209/567
7,497,334 B2 * 3/2009 Tyvoll ................ G01N 15/1459
209/552
(Continued)

FOREIGN PATENT DOCUMENTS

DE 10353985 A1 6/2005
KR 10-2009-0095209 A 9/2009
(Continued)

OTHER PUBLICATIONS

Shih, J., et al., "Microfabricated Platform for Nanoscale Flow Sensing and Control", IEEE Sensors 2006, EXCO, Daegu, Oct. 22, 2006, pp. 4.
(Continued)

*Primary Examiner* — Gene O Crawford
*Assistant Examiner* — Muhammad Awais
(74) *Attorney, Agent, or Firm* — Foley & Lardner LLP

(57) ABSTRACT

An example system includes an input channel having a first end and a second end to receive particles through the first end, a sensor to categorize particles in the input channel into one of at least two categories, and at least two output channels. Each output channel is coupled to the second end of the input channel to receive particles from the input channel, and each output channel is associated with at least one category of the at least two categories. Each output channel has a corresponding pump operable, based on the categorization of a detected particle in a category associated with a different output channel, to selectively slow, stop, or reverse a flow of particles into the output channel from the input channel.

20 Claims, 8 Drawing Sheets

(51) Int. Cl.
*G01N 15/10* (2006.01)
*H10N 30/20* (2023.01)

(52) U.S. Cl.
CPC .............. *G01N 2015/1006* (2013.01); *G01N 2015/1028* (2024.01)

(58) Field of Classification Search
CPC ... G01N 2015/1493; G01N 2015/1497; G01N 2015/0288; G01N 2015/0294; G01N 2015/1006; G01N 15/1484; G01N 15/02; G01N 15/1056; B01L 3/50273; B01L 3/502761; B01L 2300/0627; B01L 2300/1827; B01L 2400/0442; B01L 2200/0652; H10N 30/2047
USPC ............................................. 209/193
See application file for complete search history.

(56) References Cited

U.S. PATENT DOCUMENTS

| | | | | |
|---|---|---|---|---|
| 8,963,095 | B2* | 2/2015 | Li | G01N 15/1484 250/364 |
| 9,114,402 | B2* | 8/2015 | Yamamoto | G01N 15/1031 |
| 9,260,693 | B2* | 2/2016 | Johnson | B01L 3/502761 |
| 9,797,836 | B1* | 10/2017 | Sinclair | G01N 15/147 |
| 2002/0121443 | A1* | 9/2002 | O'Connell | G01N 30/00 204/600 |
| 2003/0234210 | A1* | 12/2003 | Deshpande | F16K 99/0028 209/581 |
| 2005/0249636 | A1* | 11/2005 | Tacklind | G01N 15/1484 422/400 |
| 2006/0170912 | A1* | 8/2006 | Mueth | C12M 47/06 356/244 |
| 2008/0160603 | A1* | 7/2008 | Sundararajan | F04B 43/043 435/288.5 |
| 2011/0003330 | A1* | 1/2011 | Durack | B01L 3/502761 435/287.1 |
| 2011/0030808 | A1* | 2/2011 | Chiou | F16K 99/0001 137/833 |
| 2011/0089328 | A1* | 4/2011 | Li | G01N 15/1031 324/693 |
| 2012/0196288 | A1* | 8/2012 | Beer | C12Q 1/686 435/6.12 |
| 2012/0277902 | A1* | 11/2012 | Sharpe | G01N 15/1404 209/132 |
| 2015/0226657 | A1* | 8/2015 | Foster | G01N 15/10 422/527 |
| 2015/0268244 | A1* | 9/2015 | Cho | G01N 15/1433 435/7.23 |
| 2015/0293009 | A1* | 10/2015 | Henning | G01N 15/10 356/72 |
| 2015/0316463 | A1* | 11/2015 | Pariseau | G01N 15/1429 356/338 |
| 2016/0103056 | A1* | 4/2016 | Vacca | G01N 15/1429 250/576 |
| 2017/0227446 | A1* | 8/2017 | Tabata | G01N 15/1459 |
| 2017/0248508 | A1* | 8/2017 | Ward | B01L 3/502776 |
| 2017/0307626 | A1* | 10/2017 | Griffiths | G01N 33/543 |

FOREIGN PATENT DOCUMENTS

| | | |
|---|---|---|
| WO | 2007/009983 A1 | 1/2007 |
| WO | 2009/139246 A1 | 11/2009 |
| WO | 2012/110943 A1 | 8/2012 |
| WO | 2014/142924 A1 | 9/2014 |
| WO | 2016/122552 A1 | 8/2016 |
| WO | 2017/055581 A1 | 4/2017 |
| WO | 2018/005984 A1 | 1/2018 |

OTHER PUBLICATIONS

Wang, X. et al., "An Integrated Inertial Microfluidic Vortex Sorter for Tunable Sorting and Purification of Cells", Technology, vol. 4, No. 2, Jun. 2016, pp. 88-97.

* cited by examiner

PARTICLE CATEGORIZATION

CROSS-REFERENCE TO RELATED APPLICATIONS

This application is a continuation of U.S. patent application Ser. No. 16/768,878, filed Jun. 1, 2020, which was filed under 35 U.S.C. § 371 as a National Stage of PCT International Application No. PCT/US2018/015783, filed Jan. 29, 2018, which are incorporated by reference herein in their entireties.

BACKGROUND

Microfluidic devices are increasingly commonplace in a variety of environments. For example, microfluidic devices have applicability in biology, medicine, genetics and numerous other fields. Microfluidic devices may include such devices as lab-on-a-chip micro-total analytical systems and can carry, analyze, or process various particles, bacteria, biological cells and other solid and soft objects of microscale. Various microfluidic devices may include fluids flowing through narrow channels. In a lab-on-a-chip, for example, blood cells may be moved from one chamber to another, such as from an input port to a reaction chamber. In other examples, the microfluidic device may be provided for the flow of other fluids or materials, such as blood or other biological fluids.

BRIEF DESCRIPTION OF THE DRAWINGS

For a more complete understanding of various examples, reference is now made to the following description taken in connection with the accompanying drawings in which.

DETAILED DESCRIPTION

As noted above, microfluidic devices may be provided to flow fluids through narrow channels to, for example, reaction chambers. In various examples, the fluids may include any number of particles within a flow. A reaction chamber or another output of the channels may use the particles in a separated or concentrated condition. Accordingly, the various particles in a flow are separated (e.g., sorted or categorized) for use within the microfluidic device or for output from the microfluidic device.

In order to separate the particles, some devices use a valve to open a corresponding channel to direct a particle into an appropriate channel. Such valves typically result in slowing of the flow upstream of the valve. Further, such valves have the potential to fail, resulting in failure of sorting in all output channels.

Further, categorizing or flow of particles may be facilitated with the use of pumps. While any of a variety of pumps may be used, external pumps (e.g., syringe pumps or capillary pumps) may increase complexity and expense by requiring a pump to be outside the lab-on-a-chip, for example.

Figure 1:
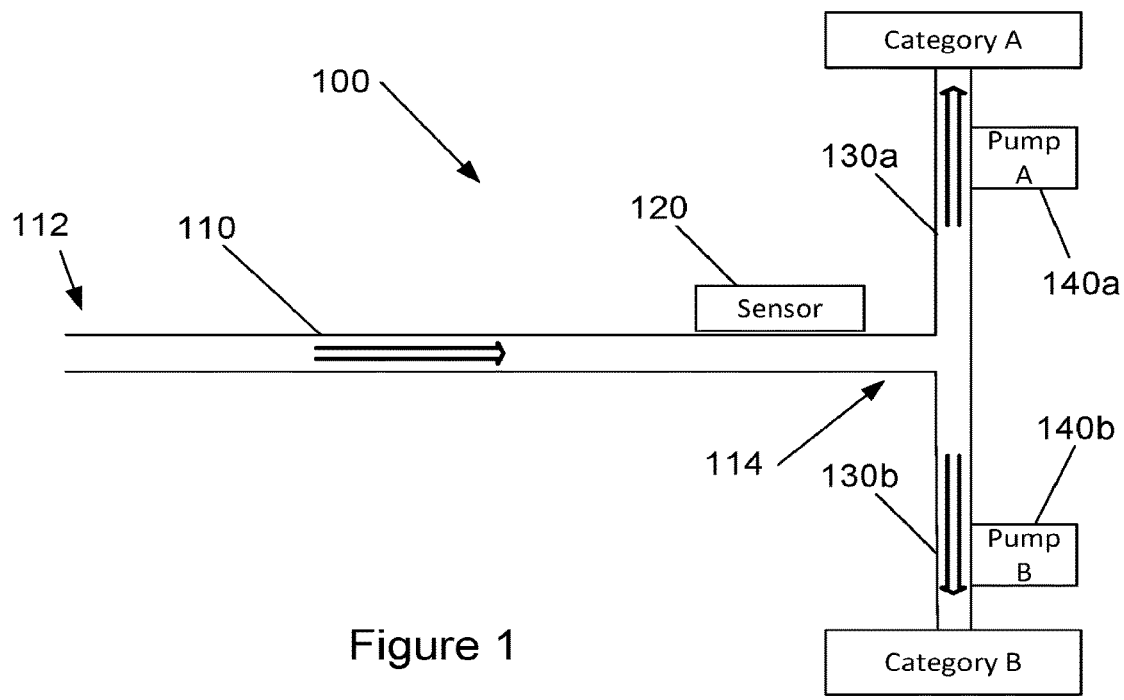
FIG. 1 illustrates an example system for categorization of particles.

Various examples described herein relate to categorizing and/or sorting of particles in, for example, a microfluidic device. A flow of particles containing at least two categories of particles is sorted by directing each particle from an input channel to one of at least two output channels, each output channel corresponding to a different category. A sensor in the input channel can detect a particle, which may be identified as belonging to a particular category, either by the sensor itself or another processor or controller. Each output channel is provided with a pump, such as an inertial pump. Activation of the pump in a particular output channel causes flow in that channel to be slowed, stopped, or reversed. Thus, flow from the input channel is directed away from the output channel with the activated pump. Based on the detection of the particle by the sensor in the input channel, the pump in each output channel not corresponding to the category of the detected particle, or corresponding to a category that is different than the category of the detected particle, is activated. Thus, flow is slowed, stopped, or reversed in output channels corresponding to a different category than the category of the detected particle, and the detected particle is directed into the output channel corresponding to its category. Further, in various examples, each pump may be an inertial pump that is integrated within the device, such as within a corresponding channel, Referring now to the Figures, FIG. 1 illustrates an example system for categorizing, or sorting, of particles. The example system may be any of a variety of devices, such as microfluidic devices, lab-on-a-chip, or micro total analytical systems, for example. Accordingly, while the example system 100 may be described in the microfluidic context, in other examples, the example system 100 may include a system for categorizing larger particles than those found in the microfluidic environment. In the example of FIG. 1, the example system 100 includes an input channel 110 with a first end 112 and a second end 114. The input channel 110 may receive particles therein through the first end 112. An arrow in the input channel 110 illustrated in FIG. 1 indicates the direction of flow of the particles. As noted above, the particles may include any of a variety of particles such as, but not limited to, blood cells. In various examples, the input channel 110 may be a long and/or narrow channel.

In various examples, the example system 100 is a microfluidic device, and the input channel 110 is a microfluidic channel. In one example, the input channel 110 has a cross-sectional width of between about 10 μm and about 500 μm. Various examples of the system 100 may be formed by performing various microfabrication and/or micromachining processes on a substrate to form and/or connect structures and/or components. The substrate may comprise a silicon based wafer or other such similar materials used for microfabricated devices (e.g., glass, gallium arsenide, plastics, etc.). Examples may comprise microfluidic channels, fluid actuators, and/or volumetric chambers. Microfluidic channels and/or chambers may be formed by performing etching, microfabrication processes (e.g., photolithography), or micromachining processes in a substrate. Accordingly, microfluidic channels and/or chambers may be defined by surfaces fabricated in the substrate of a microfluidic device. In some implementations, microfluidic channels and/or chambers may be formed by an overall package, wherein multiple connected package components that combine to form or define the microfluidic channel and/or chamber.

In the example of FIG. 1, the example system 100 includes a sensor 120. In various examples, the sensor 120 may be selected from any of a variety of types of sensors. For examples, the sensor 120 may include, but not limited to, an electrical current sensor, an impedance sensor, an optical sensor, magnetic, imaging, or a thermal sensor. The sensor 120 of the example system 100 is provided to categorize particles in the input channel 110 into one of at least two categories. For example, a stream of particles flowing through the input channel 110 may include two, three, or more different categories of particles. In various examples, the categories of particles may include, but not limited to, solid particles, soft particles, gas bubbles, biological cells, droplets of fluid (e.g., immiscible fluid, also referred to as colloidal particles), and clusters thereof. A category may include a particular type of particle or a group of types of particles. For example, in one example, a category may include all blood cells, and in another example, a category may include a particular type of blood cell. In one example, the sensor is positioned to allow detection of a particle and identification of at least one parameter associated with the particle which allows categorization of the particle.

The example system 100 further includes at least two output channels 130a, 130b that are coupled to the second end 114 of the input channel 110 to receive particles from the input channel 110. In the example illustrated in FIG. 1, a flow of particles in the input channel 110 forks into one of the two output channels 130a, 130b. The arrows in the output channels 130a, 130b in FIG. 1 indicate the direction of flow of the particles in the output channels 130a, 130b. In various examples, the input channel 110 may be coupled to any practical number of output channels 130, such as three, four, or more output channels. Each output channel 130a, 130b is associated with at least one category of the at least two categories. For example, in one example, the flow of particles through the input channel 110 includes particles belonging to category A and category B. In the example of FIG. 1, one output channel 130a is associated with category A, and the outer output channel 130b is associated with category B.

In the example system 100 of FIG. 1, each output channel 130a, 130b is provided with a corresponding pump 140a, 140b. In the example in which the example system 100 is a microfluidic device, each pump 140a, 140b may be an inertial pump. As used herein, an inertial pump corresponds to a fluid actuator and related components disposed in an asymmetric position in a microfluidic channel, where an asymmetric position of the fluid actuator corresponds to the fluid actuator being positioned less distance from a first end of a microfluidic channel as compared to a distance to a second end of the microfluidic channel. Accordingly, in some examples, a fluid actuator of an inertial pump is not positioned at a mid-point of a microfluidic channel. The asymmetric positioning of the fluid actuator in the microfluidic channel facilitates an asymmetric response in fluid proximate the fluid actuator that results in fluid displacement when the fluid actuator is actuated. Repeated actuation of the fluid actuator causes a pulse-like flow of fluid through the microfluidic channel.

In some examples, an inertial pump includes a thermal actuator having a heating element (e.g., a thermal resistor) that may be heated to cause a bubble to form in a fluid proximate the heating element. In such examples, a surface of a heating element (having a surface area) may be proximate to a surface of a microfluidic channel in which the heating element is disposed such that fluid in the microfluidic channel may thermally interact with the heating element. In some examples, the heating element may comprise a thermal resistor with at least one passivation layer disposed on a heating surface such that fluid to be heated may contact a topmost surface of the at least one passivation layer. Formation and subsequent collapse of such bubble may generate circulation flow of the fluid. As will be appreciated, asymmetries of the expansion-collapse cycle for a bubble may generate such flow for fluid pumping, where such pumping may be referred to as "inertial pumping." In other examples, a fluid actuator corresponding to an inertial pump may comprise a membrane (such as a piezoelectric membrane) that may generate compressive and tensile fluid displacements to thereby cause fluid flow.

Of course, in other examples, any of a variety of other types of pumps may be used. Each pump 140a, 140b is operable, based on the categorization of a detected particle (e.g., by the sensor 120), to selectively slow, stop, or reverse flow of particles into the output channel 130a, 130b from the input channel 110. In this regard, the pump 140a, 140b may pump a fluid in a direction opposite the direction of the flow of particles from the input channel 110. The rate of pumping of the fluid by the pump 140a, 140b may be sufficient to slow, stop, or reverse the flow from the input channel 110.

In various examples, the input channel 110 and each output channel 130a, 130b are microfluidic channels. In this regard, the input channel 110 and the output channels 130a, 130b may have a cross-sectional width of between about 10 μm and about 500 μm, for example.

Figure 2:
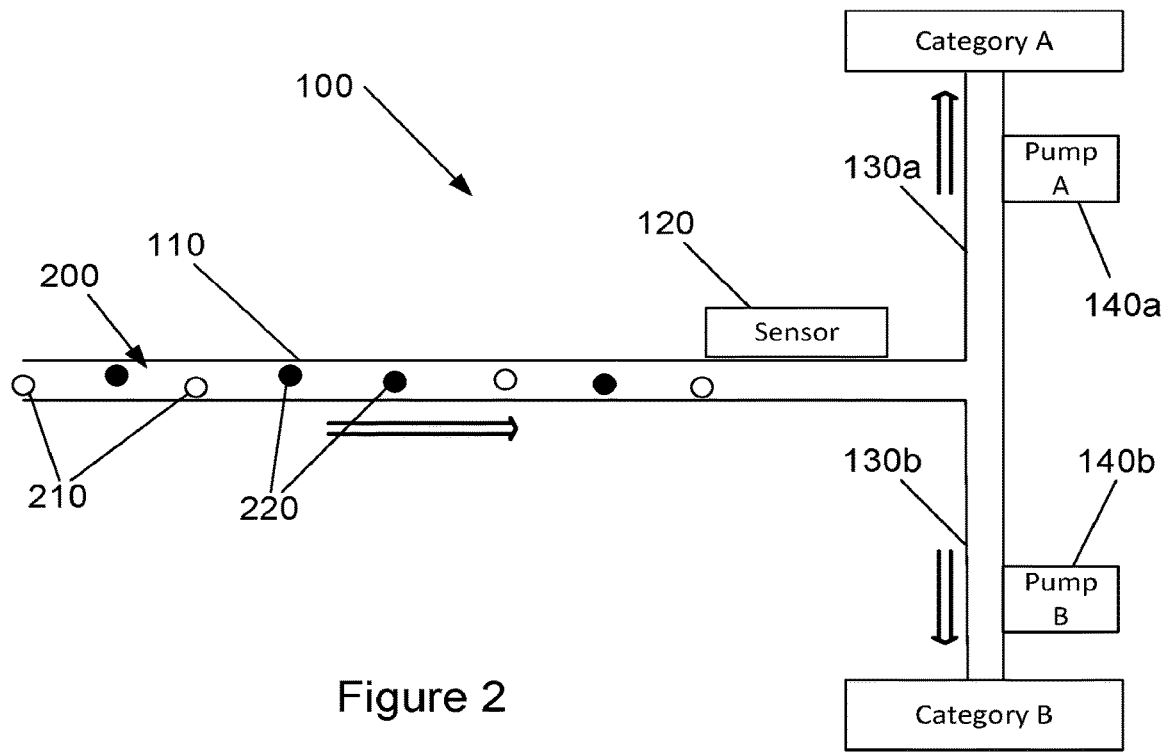
FIGS. 2-6 illustrate an example categorization of particles using the example system of FIG. 1.

Referring now to FIGS. 2-6, an example categorizing of particles using the example system 100 of FIG. 1 is illustrated. Referring first to FIG. 2, a flow of particles 200 is illustrated flowing through the input channel 100. The term "particles" is used herein to refer to any of a variety of objects including, but not limited to, solid particles, soft particles, gas bubbles, biological cells, droplets of fluid (e.g., immiscible fluid, also referred to as colloidal particles, or their agglomerates), and clusters thereof. As noted above, the direction of the flow is indicated by the arrow, as left to right in FIG. 1. The flow of particles 200 includes particles belonging to at least two categories. In the example illustrated in FIGS. 2-6, the flow includes particles in two categories, category A and category B. The particles belonging to category A are illustrated as open circles 210, and the particles belonging to category B are illustrated as closed circles 220. In one example, the example system 100 may operate to provide a concentration of one particle. In this regard, the desired particle may be indicated as category A and may be directed to a reservoir to hold the particle in a concentrated form. Category B may indicate all other particles in the flow 200, which may be considered waste, and may be directed to a waste chamber.

Figure 3:
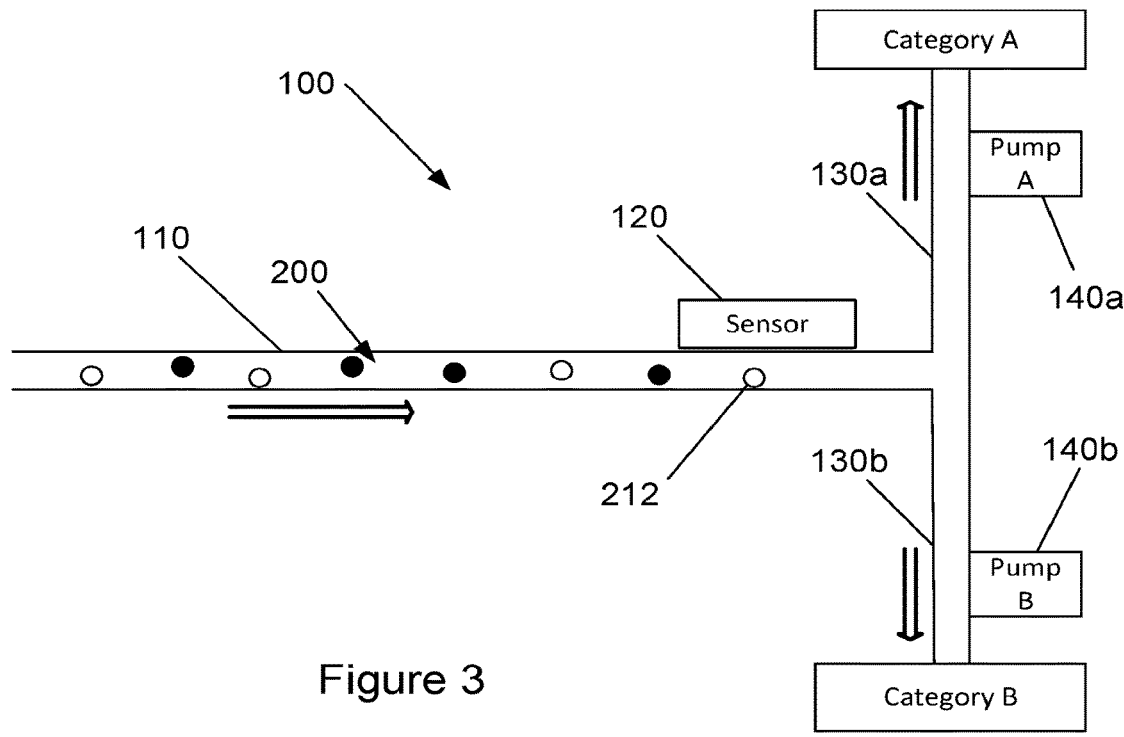

Referring now to FIG. 3, a particle 212 reaches a point in the input channel 110 where it is detected by the sensor 120. The sensor 120 may detect not only the presence of the particle 212 in a detection zone, for example, of the input channel 110, but may also detect a characteristic of the particle which allows categorization of the particle 212 into one of the set of categories (e.g., category A or category B). Such characteristics may include any of a variety of parameters, such as size, shape, dielectric constant, electric polarizability, magnetic susceptibility, magnetic moment, optical refractive index, color, luminescence, thermal capacitance, and thermal conductivity, for example. In various examples, the sensor 120 itself may categorize the particle 212 based on the detected characteristic, or the sensor 120 may provide a signal to a controller indicating the detected characteristic for the controller to perform the categorization. In the example illustrated in FIG. 3, the detected particle 212 is characterized as belonging to category A.

Figure 4:
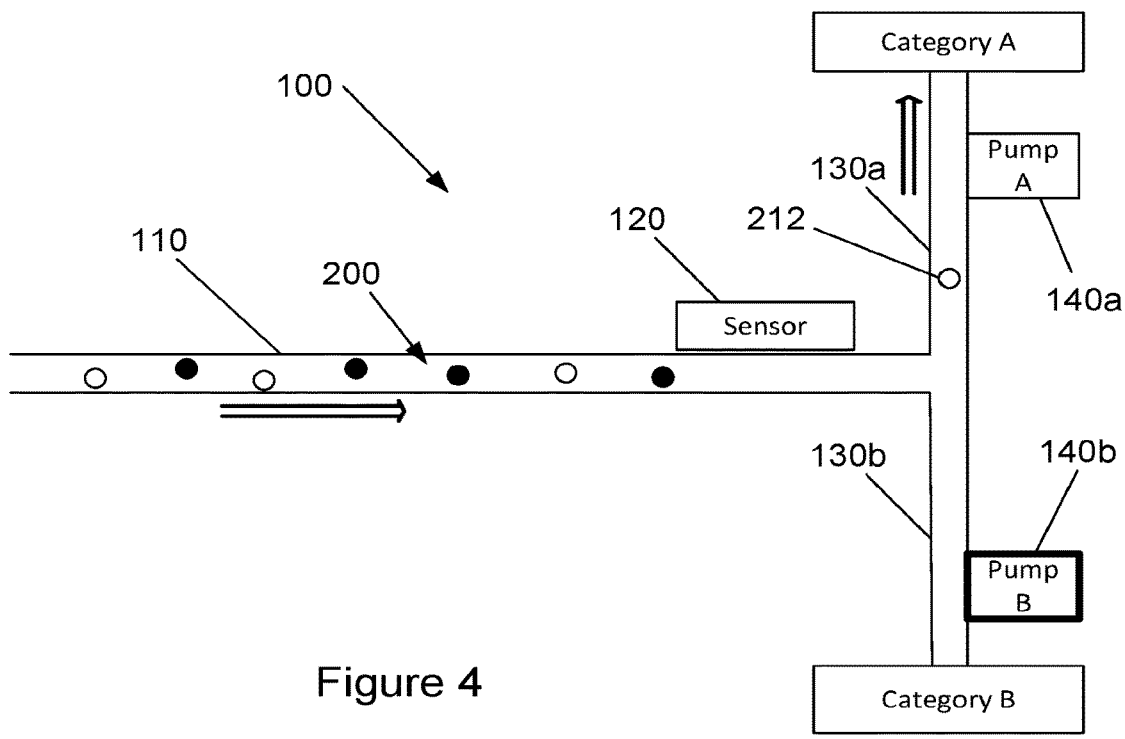

Referring now to FIG. 4, based on the categorization of the particle 212 in category A, pumps corresponding to all output channels that are not associated with category A are actuated. In other words, pumps corresponding to all output channels that are associated with a different category than the identified category of the particle 212 are actuated. In the example of FIG. 4, output channel 130a is associated with category A, and output channel 130b is associated with category B. Accordingly, the pump 140b corresponding to output channel 130b is actuated, as illustrated by the bold outline of pump 140b in FIG. 4. The actuation of the pump 140b causes the flow into output channel 130b to slow, stop, or reverse, as indicated by the removal of the arrow corresponding to the output channel 130b in FIG. 4.

In various examples, the flow of the particles 200 may include a fluid which carries the particles 200 through the channel. The fluid may be a gas or a liquid, for example. In one example, the particles are solid or liquid particles, and the pumps 140a, 140b are inertial pumps. In various example, the actuation of the pump may cause the pump to force a similar or identical fluid in a direction opposite the flow from the input channel 110. This flow caused by the pump 140b serves to stop, slow, or reverse the flow from the input channel 110. As illustrated in FIG. 4, this causes the particle 212 to flow into the output channel 130a corresponding to the category (category A) associated with the particle 212.

Figure 5:
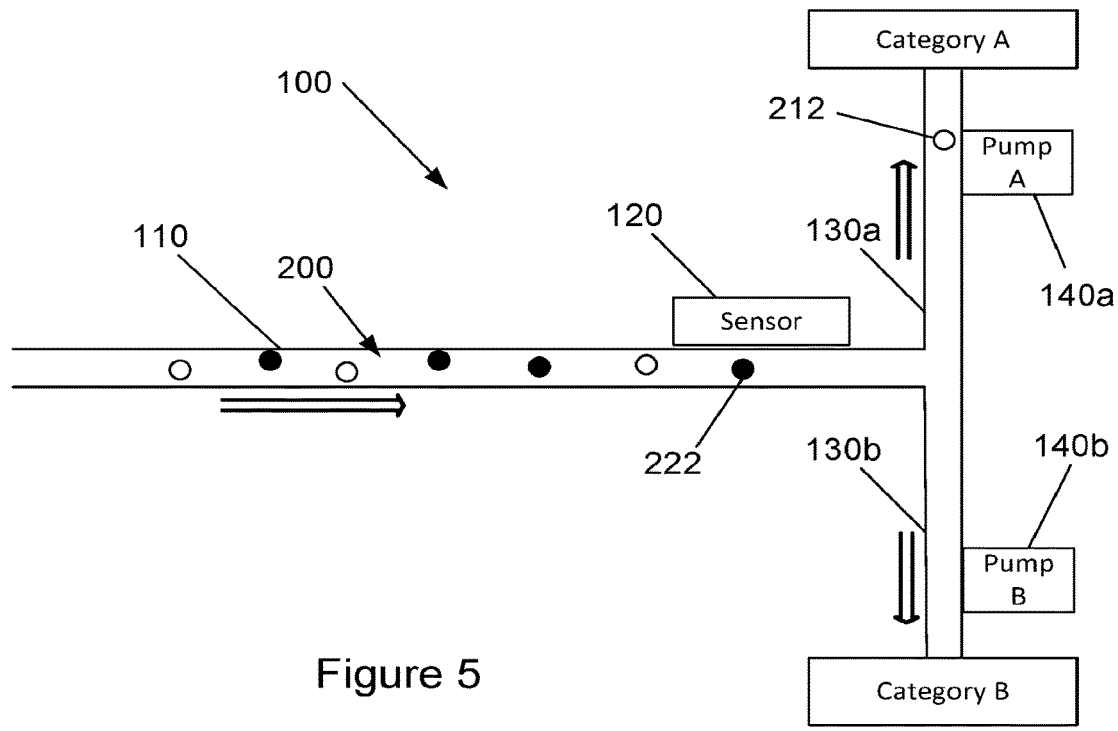
Figure 6:
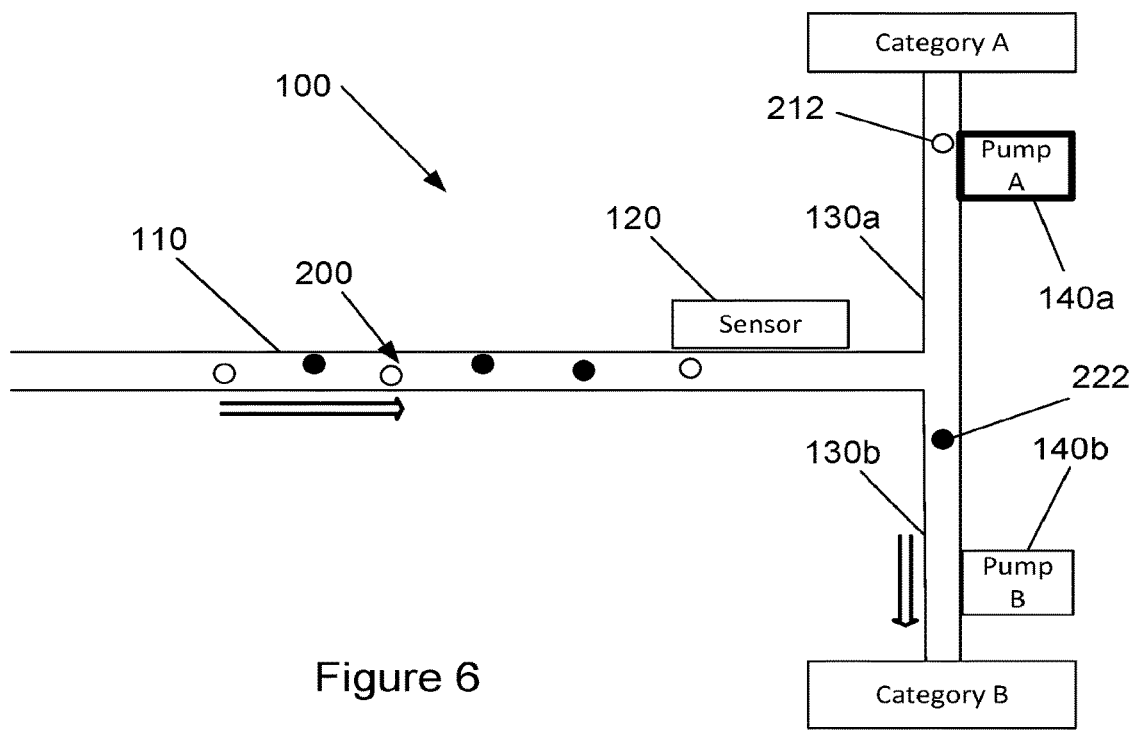

Referring now to FIG. 5, the flow of particles 200 in the input channel 110 continues with another particle being detected by the sensor 120. In the example of FIG. 5, the next particle 222 belongs to category B (as indicated by the closed circle). Based on the categorization of the particle 222 in category B, pumps corresponding to all output channels that are associated with a category that is different from category B are actuated. As illustrated in FIG. 6, the pump 140a corresponding to output channel 130a, which is associated with category A, is actuated, as illustrated by the bold outline of pump 140a in FIG. 6. The actuation of the pump 140a causes the flow into output channel 130a to slow, stop, or reverse, as indicated by the removal of the arrow corresponding to the output channel 130a in FIG. 6. The particle 222 is thus directed into the appropriate output channel 130b corresponding the categorization of the particle 222 into category B.

As noted above, in various examples, the pumps corresponding to all output channels that are associated with a category that is different from the identified category are actuated to slow, stop, or reverse flow in those channels. For example, with reference to FIG. 6, the pump 140a may be actuated to slow flow into the output channel 130a that corresponds to a different category (category A) than the identified category B of the incoming particle 222. The slower flow rate in the output channel 130a may cause the particle 212 already in the output channel 130a to continue flowing, but the slower flow rate in the output channel 130a causes the incoming particle 222 to flow into the output channel 130b associated with the identified category B.

Similarly, if the pump 140a is actuated to stop flow into the output channel 130a that corresponds to a category that is different from category B, the particle 212 already in the output channel 130a may stop flowing and hold its position within the output channel 130a. The stopped flow in the output channel 130a causes the incoming particle 222 to flow into the output channel 130b associated with the identified category B of the incoming particle 222 since the flow into the output channel 130b continues to flow.

Finally, if the pump is actuated to reverse the flow in the output channel 130a that corresponds to a category that is different from category B, the particle 212 already in the output channel 130a may reverse direction and flow toward the entrance to the output channel 130a. In some examples, an additional sensor may be provided proximate to the entrance of the output channel 130a (e.g., at the intersection of the output channel 130a and the input channel 110) to prevent the particle 212 from going into the input channel 110 or a different output channel (e.g., output channel 130b). The reversed flow in the output channel 130a causes the incoming particle 222 to flow into the output channel 130b associated with the identified category B since the flow into the output channel 130b continues to flow in the forward direction, as indicated by the arrow in FIG. 6.

This categorizing process may then continue for subsequent particles 200 in the input channel 110. As the particles are sorted into the output channels 130a, 130b corresponding to the categorization of each particle, the particles 200 may be directed into, for example, reservoirs, reaction chambers, or further sorting channels.

Figure 7:
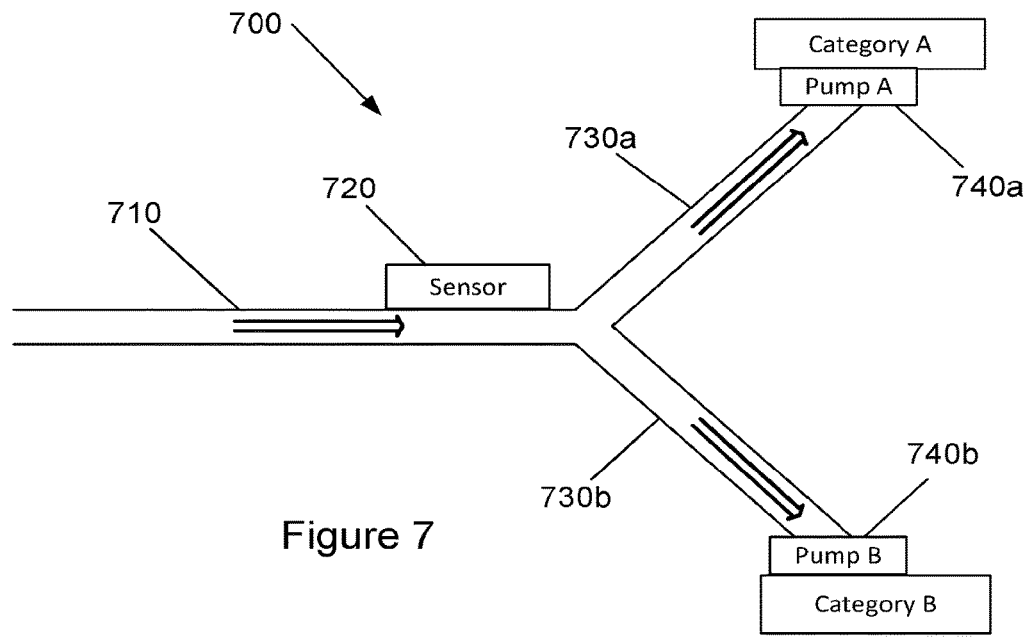
FIG. 7 illustrates another example system for categorization of particles.

In the example system 100 of FIGS. 1-6, the output channels 130a, 130b are shown coupled to the input channel 110 in a perpendicular orientation. It will be understood that this manner of coupling is illustrated for schematic purposes and, in various examples, the output channels 130a, 130b may be coupled to the input channel 110 in any feasible orientation. For example, FIG. 7 illustrates an example system 700 in which the output channels 730a, 730b fork from an input channel 710 to form a Y-shape intersection. Of course, a variety of other arrangements is possible and is contemplated within the scope of the present disclosure.

Figure 8:
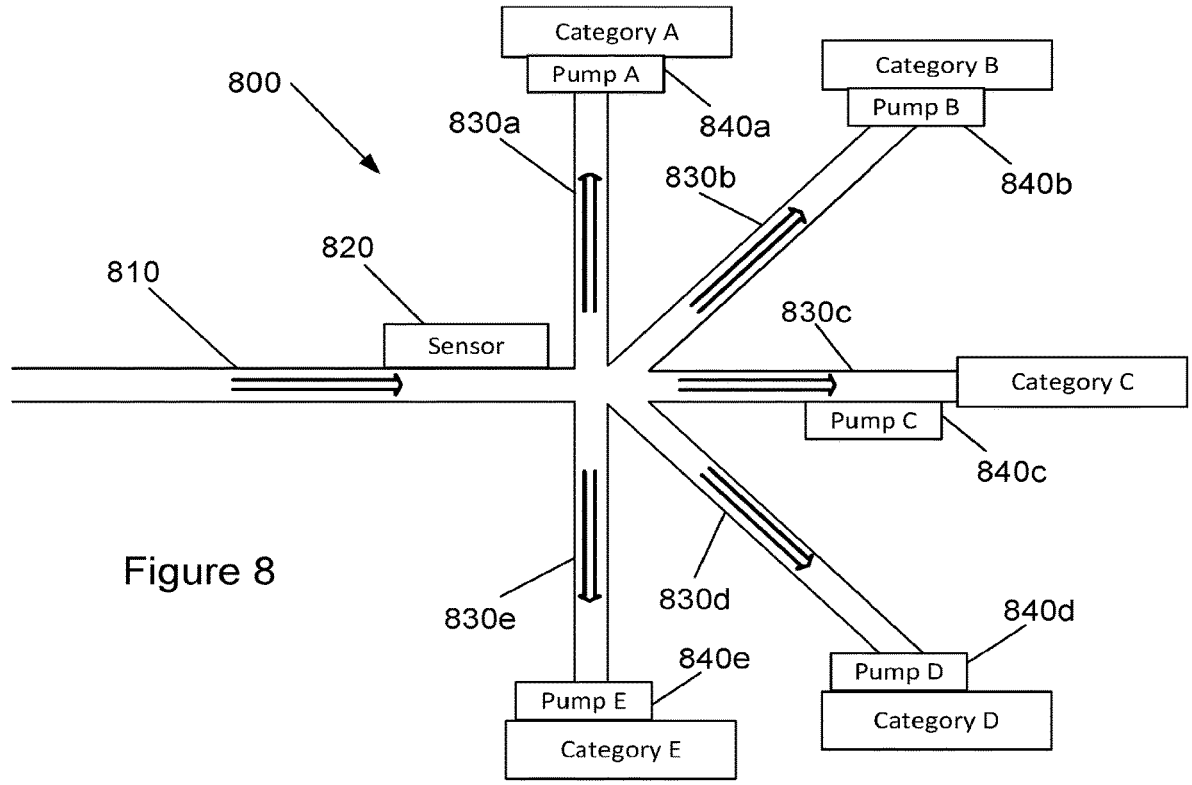
FIG. 8 illustrates another example system for categorization of particles.

Further, in the example system 100 of FIGS. 1-6, the input channel 110 is coupled to two output channels 130a, 130b. In other examples, an example system may include a larger number of output channels forming a two-dimensional intersection or a three-dimensional intersection. For example, FIG. 8 illustrates an example system 800 in which an input channel 810 is coupled to five output channels 830a-e. Of course, any practical number of output channels 830a-e coupled to the input channel 810 is possible and is contemplated within the scope of the present disclosure.

Figure 9:
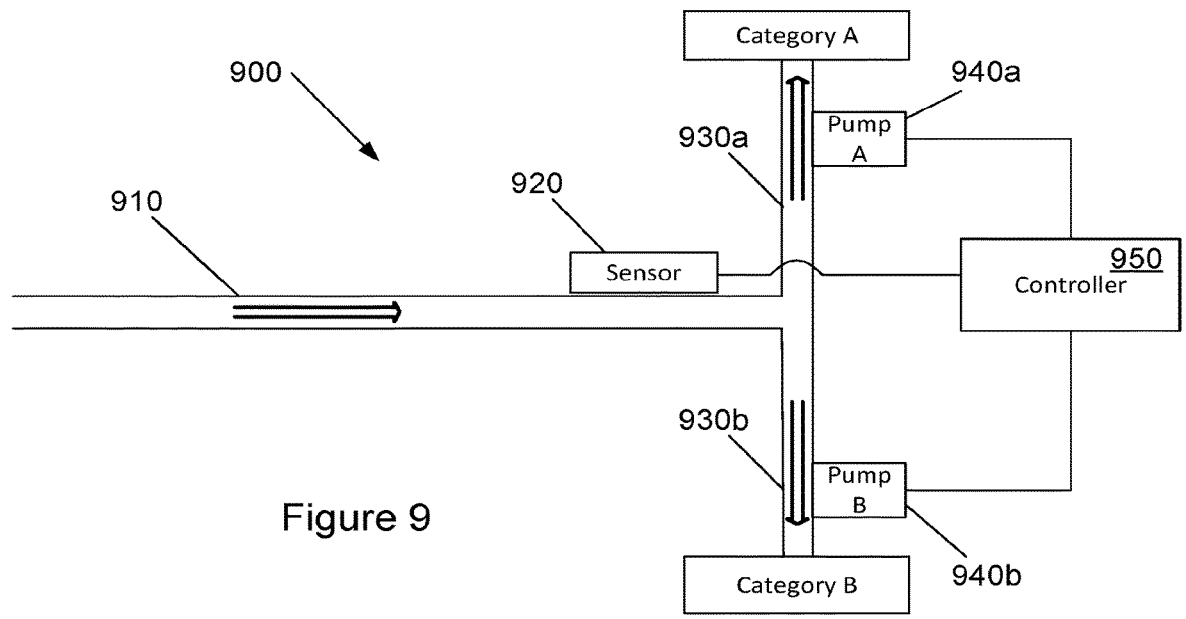
FIG. 9 illustrates another example system for categorization of particles.

Referring now to FIG. 9, another example system for categorizing of particles is illustrated. The example system 900 of FIG. 9 is similar to the example system 100 described above with reference to FIGS. 1-6 and includes an input channel 910, a sensor 920 and output channels 930a, 930b. Similar to the example system 100 described above, the example system 900 of FIG. 9 is provided with pumps 940a, 940b associated with each output channel 930a, 930b.

The example system 900 of FIG. 9 is further provided with a controller 950. The controller 950 is coupled to the sensor 920 and to each pump 940a, 940b in the output channels 930a, 930b. In various examples, the controller 950 may receive signals from the sensor 920, such as signals to indicate detection of a particle in the input channel 910. In various examples, the signals from the sensor 920 are indicative of categorization of the particle in a selected category of the at least two categories (e.g., category A or category B). In various examples, the signal received by the controller 950 from the sensor 920 may provide the category of the detected particle. In other examples, the signal may provide a characteristic of the detected particle, enabling the controller 950 to determine the appropriate category of the particle.

As noted above, the controller 950 of the example system 900 is coupled to each pump 940a, 940b corresponding to each output channel 930a, 930b. Based on the categorization of the particle detected by the sensor 920, the controller 950 may send signals to the appropriate pump(s) 940a, 940b to facilitate categorizing or sorting of the detected particle. For example, as described above with reference to FIGS. 2-6, the controller 950 may actuate the pump corresponding to each output channel 930a, 930b that is associated with a category that is different from the category of the detected particle.

Figure 10:
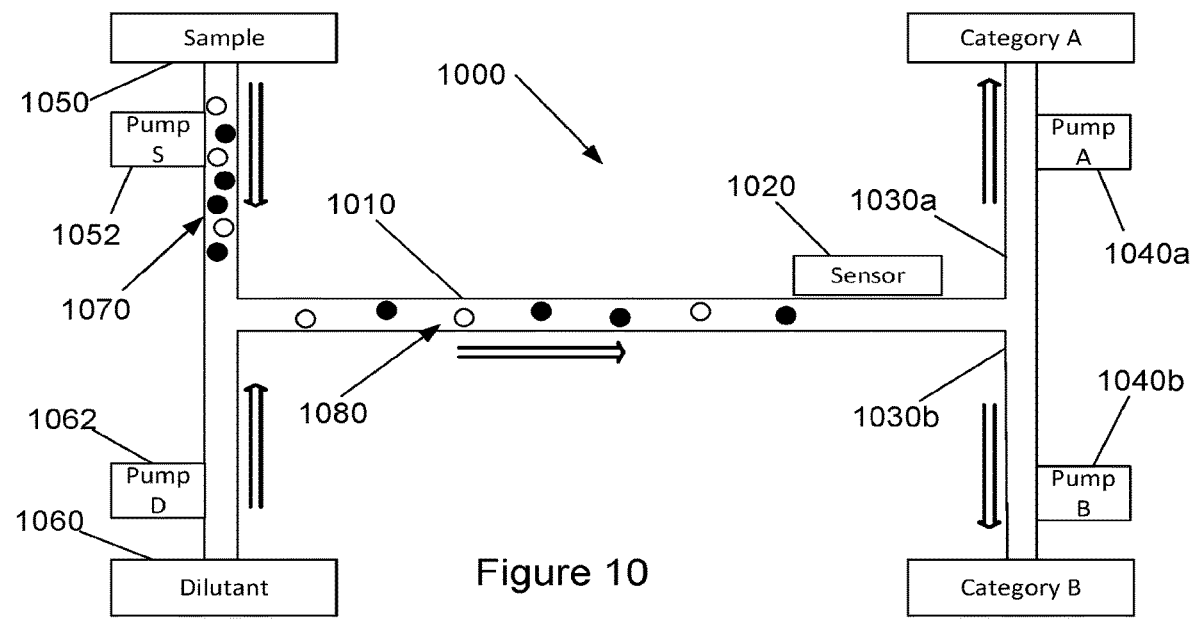
FIG. 10 illustrates another example system for categorization of particles.

Referring now to FIG. 10, another example system for categorizing of particles is illustrated. The example system 1000 of FIG. 10 is similar to the example system 100 described above with reference to FIGS. 1-6 and includes an input channel 1010, a sensor 1020 and output channels 1030a, 1030b. Similar to the example system 100 described above, the example system 1000 of FIG. 10 is provided with pumps 1040a, 1040b associated with each output channel 1030a, 1030b.

In the example system 1000 of FIG. 10, the flow of particles in the input channel 1010 is received from a sample source 1050. The sample source 1050 may be, for example, a reservoir or a reaction chamber which outputs the flow of particles 1070. The flow of particles 1070 from the sample source 1050 may contain a density or concentration of particles that may be greater than desired for the categorizing process. In this regard, the example system 1000 of FIG. 10 is provided with a dilutant 1060 which is directed to combine with the flow of particles 1070 from the sample source 1050. In various examples, the dilutant 1060 may be similar or identical to the fluid carrying the particles 1070 from the sample source 1050.

The combining of the dilutant 1060 with the flow of particles 1070 from the sample source results in a diluted flow of particles 1080 through the input channel 1010. In FIG. 10, the diluted flow of particles 1080 is illustrated with increased spacing between the particles. The diluted flow of particles 1080 can then be sorted as described above with reference to FIGS. 2-6.

In various examples, as illustrated in the example of FIG. 10, pumps may be provided to control the flow of the sample and the dilutant into the input channel 1010. In the example of FIG. 10, a pump 1052 is provided to control the rate of flow of the sample 1050, and a pump 1062 is provided to control the rate of flow of the dilutant 1060. In this regard, the ratio of sample to dilutant, or the dilution of the sample 1050, can be controlled. The pumps 1040a, 1040b in the output channels 1030a, 1030b may facilitate categorizing or sorting of particles, as described above.

Figure 11:
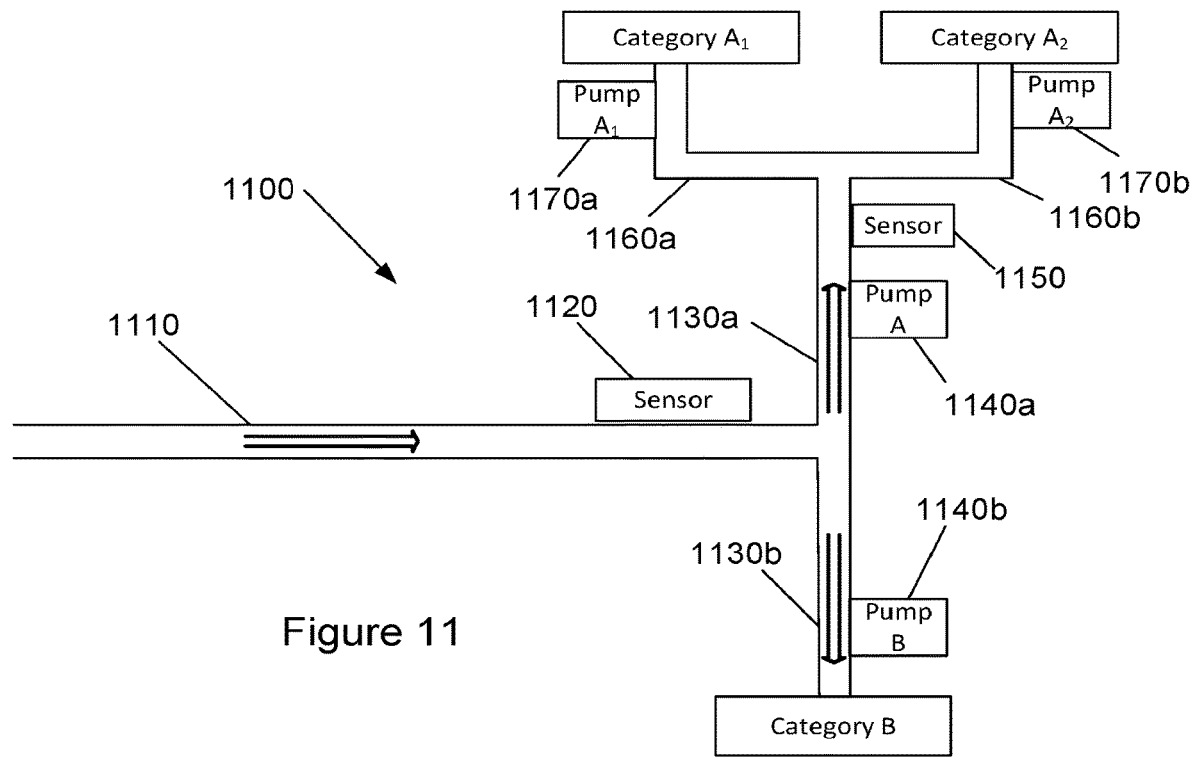
FIG. 11 illustrates another example system for categorization of particles.

Referring now to FIG. 11, another example system for categorizing of particles is illustrated. The example system 1100 of FIG. 11 is similar to the example system 100 described above with reference to FIGS. 1-6 and includes an input channel 1110, a sensor 1120 and output channels 1130a, 1130b. Similar to the example system 100 described above, the example system 1100 of FIG. 11 is provided with pumps 1140a, 1140b associated with each output channel 1130a, 1130b.

As noted above, in some examples, a category of particles may include a group of types of particles, such as all types of blood cells. In such cases, it may be desirable to further sort the category of particles into at least two subcategories. In this regard, the example system 1100 of FIG. 11 includes an output channel sensor 1150 positioned to detect particles in the output channel 1130a. The output channel sensor 1150 may be provided to categorize particles flowing through the output channel 1130a into one of at least two sub-categories. The example system 1100 further includes at least two sub-output channels 1160a, 1160b that are coupled to the output channel 1130a. Thus, the sub-output channels 1160a, 1160b are to receive particles from the output channel 1130a. Each sub-output channel 1160a, 1160b is associated with a sub-category. In the example of FIG. 11, the sub-output channel 1160a is associated with sub-category $A_1$, and the sub-output channel 1160b is associated with sub-category $A_2$.

In the example system 1100 of FIG. 11, each sub-output channel 1160a, 1160b is provided with a corresponding pump 1170a, 1170b. The pumps 1170a, 1170b are operable to selectively slow, stop, or reverse flow of particles into the corresponding sub-output channel 1160a, 1160b from the output channel 1130a. Each pump 1170a, 1170b is operable, based on the categorization of a detected particle (e.g., by the output channel sensor 1150), to selectively slow, stop, or reverse flow of particles into the sub-output channel 1160a, 1160b from the output channel 1130a. As noted above, actuation of the pumps 1170a, 1170b may be based on categorization of a particle in the output channel 1130a. In the example of FIG. 11, the sub-output channel 1160a is associated with category $A_1$, and sub-output channel 1160b is associated with category $A_2$. Thus, if a particle detected by the output channel sensor 1150 is categorized as category $A_1$, pumps corresponding to all sub-output channels that are associated with a category that is different from category $A_1$ are actuated. Accordingly, the pump 1170b corresponding to sub-output channel 1160b is actuated. Similarly, if a particle detected by the output channel sensor 1150 is categorized as category $A_2$, pumps corresponding to all sub-output channels that are associated with a category that is different from category $A_2$ are actuated. Accordingly, the pump 1170a corresponding to sub-output channel 1160a is actuated.

Figure 12:
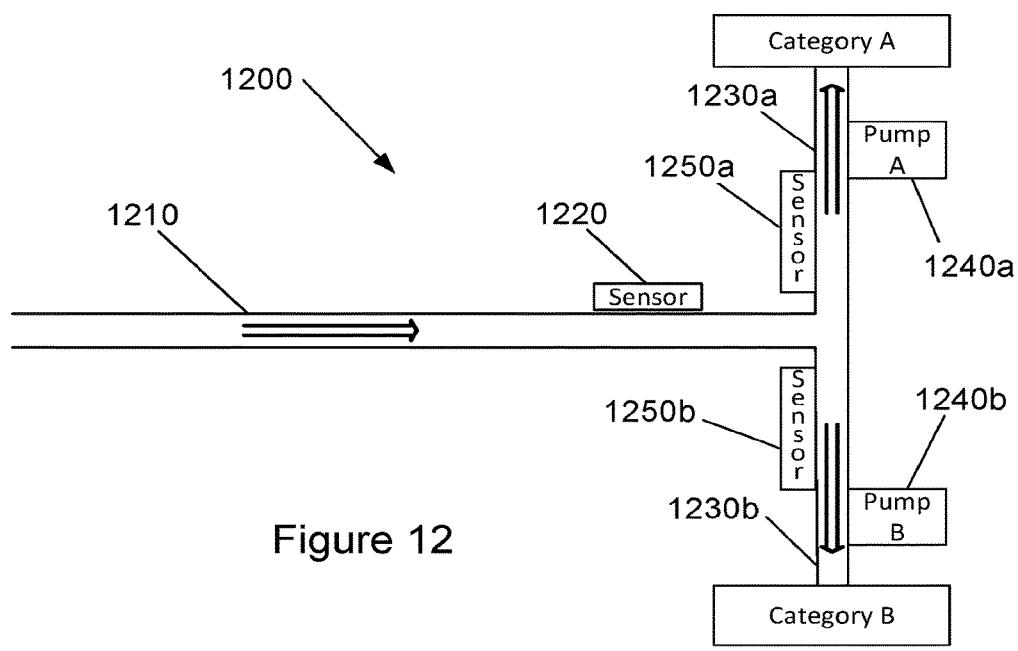
FIG. 12 illustrates another example system for categorization of particles.

Referring now to FIG. 12, another example system for categorizing of particles is illustrated. The example system 1200 of FIG. 12 is similar to the example system 100 described above with reference to FIGS. 1-6 and includes an input channel 1210, a sensor 1220 and output channels 1230a, 1230b. Similar to the example system 100 described above, the example system 1200 of FIG. 12 is provided with pumps 1240a, 1240b associated with each output channel 1230a, 1230b.

In the example system 1200 of FIG. 12, output channel sensors 1250a, 1250b are provided in each output channel 1230a, 1230b. The output channel sensors 1250a, 1250b are provided proximate to the junction of the input channel 1210 and the corresponding output channel 1250a and may be used to facilitate timing of the actuation of the pumps. In this regard, the output channel sensors 1250a, 1250b may be used to detect a particle sorted for the corresponding channel to ensure that the sorted particle has reached a pre-determined point before the flow in the channel is stopped, slowed, or reversed for sorting of a subsequent particle. For example, with reference to FIGS. 5 and 6, prior to actuation of pump 140a for sorting of particle 222, a controller may wait for a signal from an output channel sensor, such as output channel sensor 1250a, that the previous sorted particle 212 has reached a predetermined point within the output channel 130a or 1230a.

Figure 13:
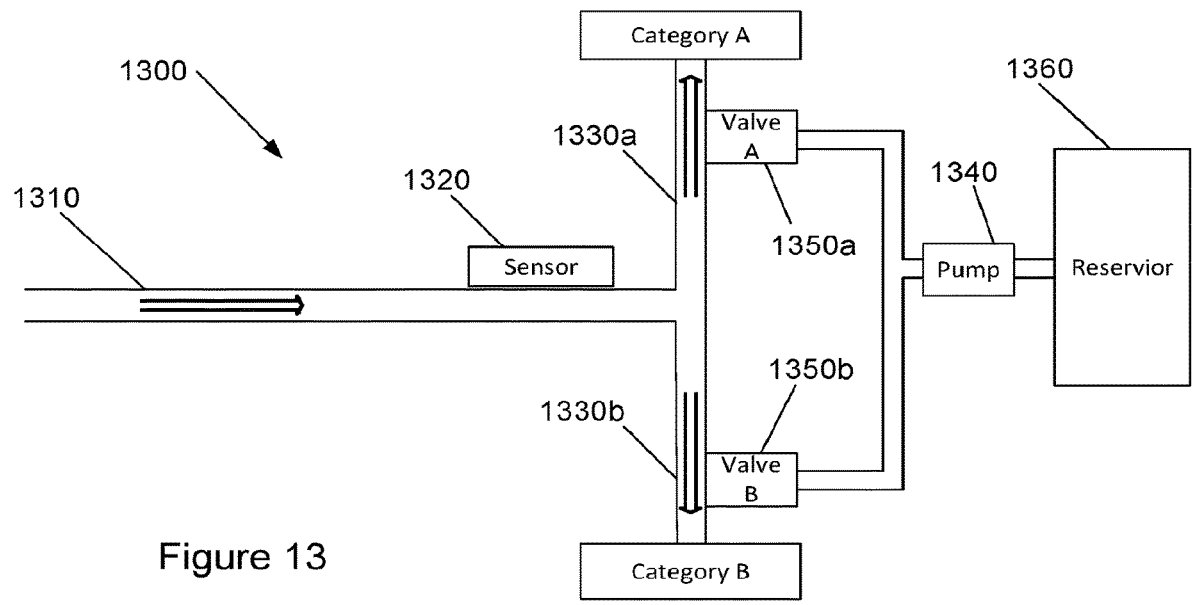
FIG. 13 illustrates another example system for categorization of particles.

Referring now to FIG. 13, another example system for categorizing of particles is illustrated. The example system 1300 of FIG. 13 is similar to the example system 100 described above with reference to FIGS. 1-6 and includes an input channel 1310, a sensor 1320 and output channels 1330a, 1330b. In the example system 1300 of FIG. 13, a single pump 1340 may be provided for at least two output channels 1330a, 1330b. In various examples, a single pump 1340 may be provided for all output channels 1330a, 1330b. The flow in the output channels 1330a, 1330b may be stopped, slowed, or reversed via the actuation of valves 1350a, 1350b associated with each output channel 1330a, 1330b. In this regard, in order to stop, slow, or reverse flow in an output channel 1330a, 1330b, a controller (e.g., the controller 950 of FIG. 9) may open the valve 1350a, 1350b associated with that channel to allow the pump 1340 to flow fluid into the output channel, thus countering the flow from the input channel. In the example system 1300 of FIG. 13, the pump 1340 may flow fluid from a reservoir 1360 into an output channel 1330a, 1330b through an open valve (e.g., valves 1350a, 1350b). The fluid in the reservoir 1360 may be a dilutant, buffer, or carrier fluid, for example. In one example, the fluid in the reservoir is a dilutant which may facilitate further sub-categorization of particles in an output channel, as described above with reference to FIG. 11.

Figure 14:
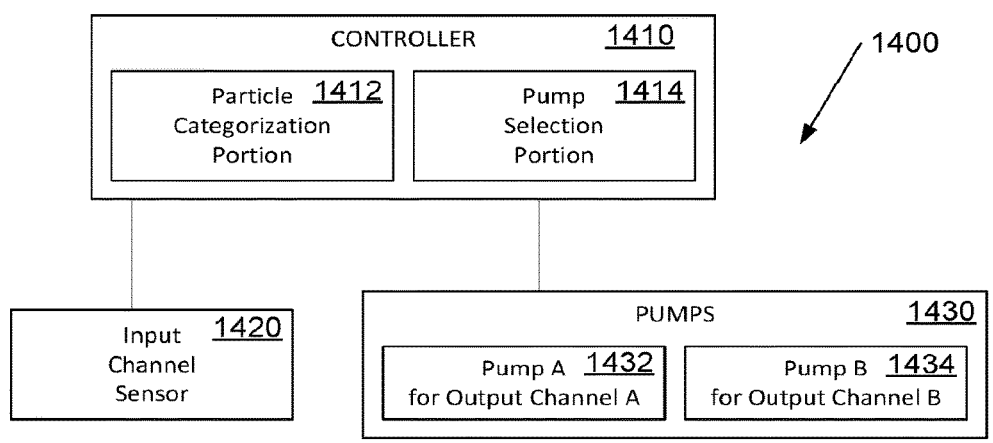
FIG. 14 is a schematic illustration of an example system for categorization of particles.

Referring now to FIG. 14, a schematic illustration of an example system for categorizing of particles is provided. In the example system 1400 may be implemented in a microfluidic device, such as those described above with reference to FIGS. 1-13. The example system 1400 includes a controller 1410. In various examples, the controller 1410 may be implemented as hardware, software, firmware, or a combination thereof. In one example, the controller 1410 is a processor coupled to or including a memory device.

The controller 1410 is coupled to an input channel sensor 1420, such as the input channel sensors 120, 920, 1020, 1120, 1220, 1320 of the systems described above with reference to FIGS. 1-13. As described above, the input channel sensor 1420 is provided to detect particles flowing through an input channel, where the input channel s coupled to at least two output channels to receive particles from the input channel. In this regard, the input channel sensor 1420 may provide signals to the controller 1410 indicative of the detection of a particle.

The controller 1410 of the example system 1400 of FIG. 14 is further coupled to a set of pumps 1430. In this regard, the pumps 1430 include pumps corresponding to each of the at least two output channels. The example system 1400 is provided for a system with two output channels and includes two pumps 1432, 1434, each pump 1432, 1434 corresponding to an output channel. As described above, each pump 1432, 1434 is operable to selectively slow, stop, or reverse flow of particles into the associated output channel from the input channel.

The controller 1410 includes a particle categorization portion 1412 to categorize a particle detected by the input channel sensor 1420. In various examples, the input channel sensor 1420 may send a signal to the controller 1410, or the particle categorization portion 1412 of the controller 1410, including a characteristic of the detected particle. The particle categorization portion 1412 may use the received characteristic to categorize the particle into one of a set of at least two categories. Each category in the set of categories corresponds to an output channel.

The controller 1410 further includes a pump selection portion 1414 to selectively operate each pump 1432, 1434. In various examples, the pump selection portion 1414 may select at least one pump for operation based on the categorization of the particle by the particle categorization portion 1412. As described above, the pump selection portion 1414 may operate a pump corresponding to each output channel not associated with the category of the detected particle. Thus, flow into each output channel associated with a category that is different from the category of the detected particle is stopped, slowed, or reversed, causing the detected particle to be sorted into the remaining output channel.

Figure 15:
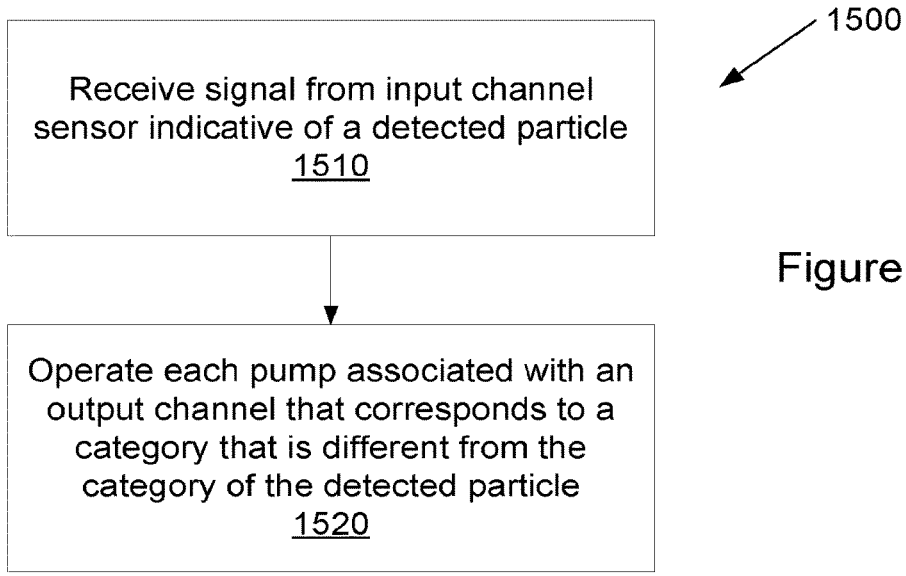
FIG. 15 is a flowchart illustrating an example method.

Referring now to FIG. 15, a flowchart illustrates an example method for categorizing particles. The example method 1500 may be implemented in, for example, the controller 1410 of the example system 1400 of FIG. 14 or the controller 950 of the example system 900 of FIG. 9. The example method 1500 includes receiving a signal from an input channel sensor indicative of a detected particle (block 1510). As described above, with reference to FIG. 3, a particle flowing through an input channel 110 may be detected by an input channel sensor 120. The input channel sensor 120 may determine at least one characteristic of the detected particle and provide that characteristic in the signal.

At block 1520, the method 1500 includes operating each pump associated with an output channel that corresponds to a category that is different from the category of the detected particle. As described above, the detected particle may be categorized into one of a set of at least two categories based on the characteristic received from the input channel sensor. Each category in the set of categories corresponds to an output channel. Based on the categorization of the detected particle, the pump associated with each output channel that corresponds to a category that is different from the category of the detected particle is activated to stop, slow, or reverse flow in that/those output channels. Thus, flow of the detected particle is directed to the appropriate output channel.

Figure 16:
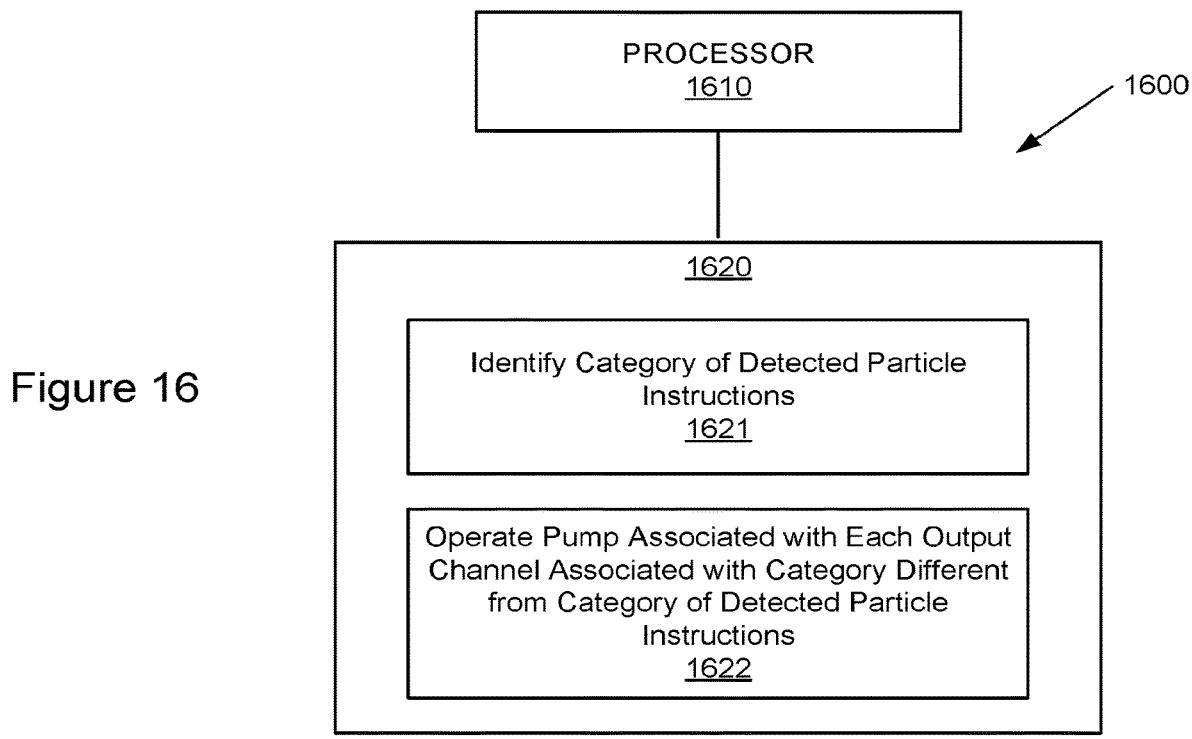
FIG. 16 illustrates a block diagram of an example system with a computer-readable storage medium including instructions executable by a processor for particle categorization.

Referring now to FIG. 16, a block diagram of an example system is illustrated with a non-transitory computer-readable storage medium including instructions executable by a processor for particle categorizing. The system 1600 includes a processor 1610 and a non-transitory computer-readable storage medium 1620. The computer-readable storage medium 1620 includes example instructions 1621-1622 executable by the processor 1610 to perform various functionalities described herein. In various examples, the non-transitory computer-readable storage medium 1620 may be any of a variety of storage devices including, but not limited to, a random access memory (RAM) a dynamic RAM (DRAM), static RAM (SRAM), flash memory, read-only memory (ROM), programmable ROM (PROM), electrically erasable PROM (EEPROM), or the like. In various examples, the processor 1610 may be a general purpose processor, special purpose logic, or the like.

The example instructions include identify a selected category of a detected particle instructions 1621. In this regard, based on a signal from a sensor in an input channel, a detected particle may be categorized into the selected category from at least two categories. As described above, the input channel is coupled to at least two output channels, each output channel being associated with a category from the at least two categories.

The example instructions further include operate a pump associated with each output channel associated with a category that is different from the selected category of the detected particle instructions 1622. As described above, pumps corresponding to each output channel associated with a category that is different from the selected category of the detected particle may be operated to slow, stop, or reverse flow of particles into the associated output channel from the input channel. Thus, the detected particle may be sorted into the appropriate channels.

Software implementations of various examples can be accomplished with standard programming techniques with rule-based logic and other logic to accomplish various database searching steps or processes, correlation steps or processes, comparison steps or processes and decision steps or processes.

The foregoing description of various examples has been presented for purposes of illustration and description. The foregoing description is not intended to be exhaustive or limiting to the examples disclosed, and modifications and variations are possible in light of the above teachings or may be acquired from practice of various examples. The examples discussed herein were chosen and described in order to explain the principles and the nature of various examples of the present disclosure and its practical application to enable one skilled in the art to utilize the present disclosure in various examples and with various modifications as are suited to the particular use contemplated. The features of the examples described herein may be combined in all possible combinations of methods, apparatus, modules, systems, and computer program products.

It is also noted herein that while the above describes examples, these descriptions should not be viewed in a limiting sense. Rather, there are several variations and modifications which may be made without departing from the scope as defined in the appended claims.

What is claimed is:

1. A microfluidic system, comprising:
an input channel having a first end and a second end to receive particles through the first end;
a sensor to detect particles in the input channel and generate, based on detection of particles, signals indicative of particle type;
a first output channel to collect particles of a first type at a first collection point and a second output channel to collect particles of a second type at a second collection point, each of the first output channel and the second output channel fluidically coupled to the second end of the input channel to receive particles from the input channel; and
a first pump associated with the first output channel, and a second pump associated with the second output channel, the first pump and the second pump operable to, based on the signals from the sensor, selectively stop or reverse particle flow and thereby (i) prevent particles of the first type in the second output channel from reaching the second collection point and (ii) prevent particles of the second type in the first output channel from reaching the first collection point.

2. The system of claim 1, further comprising a controller coupled to the sensor and to each pump, the controller configured to:
receive a signal from the sensor indicating a particle is of the first type; and
selectively actuate the second pump corresponding to the second output channel.

3. The system of claim 1, wherein the input channel and each output channel are microfluidic channels.

4. The system of claim 3, wherein each pump is an inertial pump integrated within a corresponding microfluidic channel.

5. The system of claim 1, further comprising:
an output channel sensor corresponding to at least one of the first output channel or the second output channel.

6. The system of claim 5, wherein the output channel sensor is proximate the second end of the input channel; or a combination thereof.

7. The system of claim 5, wherein the output channel sensor is to categorize particles in the first output channel into one of at least two sub-categories, the first output channel having an inlet end and an outlet end, the inlet end of the first output channel being fluidically coupled to the second end of the input channel;
the system further comprising:
at least two sub-output channels, each sub-output channel fluidically coupled to the outlet end of the first output channel to receive particles from the first output channel, each sub-output channel being associated with at least one sub-category of the at least two sub-categories, each sub-output channel having a corresponding pump operable, based on the categorization of a detected particle in the first output channel in a category associated with a different sub-output channel, to selectively slow, stop, or reverse a flow of particles into the sub-output channel from the first output channel.

8. The system of claim 1, wherein each of the first and second pumps is an inertial pump including a thermal actuator.

9. The system of claim 1, wherein each of the first and second pumps includes a piezo-electric membrane.

10. The system of claim 1, wherein the first pump and the second pump are disposed in an asymmetric position within the first output channel and the second output channel, the asymmetric position being distal from the second end of the input channel.

11. A microfluidic system, comprising:
an input channel sensor to detect particles in an input channel and generate signals based on detection of particles, the input channel having a first end and a second end and being fluidically coupled to at least two output channels at the second end, each output channel to receive particles from the input channel;
a pump associated with each of the at least two output channels, each pump being operable to selectively stop or reverse flow of particles to prevent particles from entering one of the at least two output channels from the input channel, the at least two output channels comprising a first output channel and a second output channel; and
a controller configured to:
categorize a particle based on the signals from the input channel sensor into at least two categories, each category of the at least two categories being associated with a separate output channel of the at least two output channels; and
operate a first pump associated with the first output channel to prevent particles of a second category from flowing through the first output channel, and operate a second pump associated with the second output channel to prevent particles of a first category from flowing through the second output channel.

12. The microfluidic system of claim 11, wherein the input channel and each output channel are microfluidic channels.

13. The microfluidic system of claim 11, wherein each pump is an inertial pump integrated within a corresponding channel.

14. The microfluidic system of claim 11, further comprising:
an output channel sensor to detect particles flowing through the first output channel, the first output channel being coupled to at least two sub-output channels to receive particles from the first output channel;
a sub-output pump associated with each of the at least two sub-output channels, each pump being operable to selectively slow, stop, or reverse flow of particles into the associated sub-output channel from the first output channel,
wherein the controller is further configured to:
categorize a particle detected by the output channel sensor into an identified sub-category selected from at least two sub-categories, each sub-category of the at least two sub-categories being associated with a sub-output channel of the at least two sub-output channels; and
operate each sub-output pump corresponding to a sub-output channel that is associated with a different sub-category than the identified sub-category.

15. The microfluidic system of claim 11, further comprising:
an output channel sensor corresponding to each of the at least two output channels.

16. A non-transitory computer-readable storage medium encoded with instructions executable by a processor of a computing system, the computer-readable storage medium comprising instructions to:
identify a selected category of a particle from at least two categories based on a signal from a sensor in an input channel, the input channel being fluidically coupled to at least a first output channel and a second output channel, the first output channel being associated with a first category from the at least two categories and the second output channel being associated with a second category from the at least two categories; and
operate a first pump associated with the first output channel to stop or reverse particles in the second category from flowing through the first output channel, and operate a second pump associated with the second output channel to stop or reverse particles in the first category from flowing through the second output channel.

17. The non-transitory computer-readable storage medium of claim 15, wherein the first pump is a first inertial pump provided within the first output channel and the second pump is a second inertial pump provided within the second output channel.

18. The non-transitory computer-readable storage medium of claim 15, further comprising instructions to, based on the signal from the sensor, selectively actuate the pump associated with the different category than the selected category to direct a flow of the particle.

19. The non-transitory computer-readable storage medium of claim 15, further comprising instructions to:
identify a selected sub-category of a particle from at least two sub-categories based on a signal from an output channel sensor in at least one output channel, the output channel being fluidically coupled to at least two sub-output channels, each sub-output channel being associated with a sub-category from the at least two sub-categories; and
operate a pump associated with each sub-output channel associated with a sub-category that is different from the selected sub-category of the detected particle to slow, stop, or reverse a flow of particles into the associated sub-output channel from the output channel.

20. The non-transitory computer-readable storage medium of claim 19, further comprising instructions to, based on the signal from the output channel sensor, selectively actuate the pump associated with the sub-output channel to direct a flow of the particle.

* * * * *